United States Patent
Kim

(10) Patent No.: US 12,069,355 B2
(45) Date of Patent: Aug. 20, 2024

(54) MICROPHONE STRUCTURE AND ELECTRONIC DEVICE INCLUDING THE SAME

(71) Applicant: SAMSUNG ELECTRONICS CO., LTD., Suwon-si (KR)

(72) Inventor: Gidae Kim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 292 days.

(21) Appl. No.: 17/545,102

(22) Filed: Dec. 8, 2021

(65) Prior Publication Data
US 2022/0201165 A1     Jun. 23, 2022

Related U.S. Application Data

(63) Continuation of application No. PCT/KR2021/018336, filed on Dec. 6, 2021.

(30) Foreign Application Priority Data

Dec. 22, 2020 (KR) .................. 10-2020-0180477

(51) Int. Cl.
*H04N 23/54* (2023.01)
*H04N 23/51* (2023.01)
(Continued)

(52) U.S. Cl.
CPC ............. *H04N 23/54* (2023.01); *H04N 23/51* (2023.01); *H04N 23/57* (2023.01); *H05K 1/18* (2013.01);
(Continued)

(58) Field of Classification Search
CPC ........ H04N 23/50; H04N 23/51; H04N 23/54; H04N 23/57; H04M 1/0264
(Continued)

(56) References Cited

U.S. PATENT DOCUMENTS 10,148,800 B1   12/2018   Frederickson et al.
2010/0183174 A1   7/2010   Suvanto et al.
(Continued)

FOREIGN PATENT DOCUMENTS

CN    110401747 A   *   11/2019   ............. G03B 15/05
CN    110995907 A   *   4/2020   ............ H04M 1/026
(Continued)

OTHER PUBLICATIONS

Search Report and Written Opinion issued Mar. 4, 2022 in counterpart International Patent Application No. PCT/KR2022/018336.
(Continued)

*Primary Examiner* — Anthony J Daniels
(74) *Attorney, Agent, or Firm* — NIXON & VANDERHYE P.C.

(57) ABSTRACT

An electronic device according to various embodiments may comprise: a camera module including at least one camera, a camera housing disposed to cover the camera module in a first direction, a microphone module including at least one microphone disposed in the camera housing in a second direction opposite to the first direction, a first path formed in the camera housing in a third direction perpendicular to the first direction and the second direction, and a second path formed in the camera housing to connect the first path and the microphone module.

17 Claims, 13 Drawing Sheets

(51) Int. Cl.
*H04N 23/57* (2023.01)
*H05K 1/18* (2006.01)

(52) U.S. Cl.
CPC .............. *H05K 2201/10083* (2013.01); *H05K 2201/10151* (2013.01)

(58) Field of Classification Search
USPC ......................................................... 348/374
See application file for complete search history.

(56) References Cited

U.S. PATENT DOCUMENTS

| | | |
|---|---|---|
| 2013/0012274 A1 | 1/2013 | Ko et al. |
| 2014/0112518 A1 | 4/2014 | Lee |
| 2014/0294376 A1 | 10/2014 | Kim et al. |
| 2019/0082083 A1 | 3/2019 | Jarvis et al. |
| 2020/0059579 A1 | 2/2020 | Jarvis et al. |
| 2020/0221002 A1 | 7/2020 | Akana et al. |
| 2021/0234948 A1* | 7/2021 | Li .................... H04M 1/0249 |
| 2022/0360655 A1 | 11/2022 | Jung et al. |

FOREIGN PATENT DOCUMENTS

| | | | |
|---|---|---|---|
| CN | 111901463 A * | 11/2020 | .......... H04M 1/0264 |
| KR | 10-2013-0005934 | 1/2013 | |
| KR | 10-2014-0050912 | 4/2014 | |
| KR | 10-1474128 | 12/2014 | |
| KR | 10-2021-0015268 | 2/2021 | |
| KR | 10-2021-0101462 | 8/2021 | |
| KR | 10-2022-0017316 | 2/2022 | |

OTHER PUBLICATIONS

Extended European Search Report dated Feb. 2, 2024 for EP Application No. 21911315.6.

* cited by examiner

MICROPHONE STRUCTURE AND ELECTRONIC DEVICE INCLUDING THE SAME

CROSS-REFERENCE TO RELATED APPLICATIONS

This application is a continuation of International Application No. PCT/KR2021/018336 designating the United States, filed on Dec. 6, 2021, in the Korean Intellectual Property Receiving Office and claiming priority to Korean Patent Application No. 10-2020-0180477, filed on Dec. 22, 2020, in the Korean Intellectual Property Office, the disclosures of which are incorporated by reference herein in their entireties.

BACKGROUND

Field

The disclosure relates to a microphone structure and an electronic device including the microphone structure.

Description of Related Art

The volume of a camera module included in an electronic device continues to increase because of factors such as the number of cameras included in the camera module, camera performance, increase in sensor size, and increase in lens size.

In order to cover the increased volume of the camera module, as described above, the electronic device may include a separate housing for protecting the camera module.

Meanwhile, the electronic device may include a microphone module capable of receiving an external sound. Among these microphone modules, there may be a microphone module for receiving a sound in a direction that matches the photographing direction of the camera module. This microphone module may be used to receive sound when shooting an image through the camera module. Also, the microphone module may be disposed adjacent to the camera module. A microphone module that receives a sound in a direction coincident with the shooting direction of the camera module may be disposed adjacent to the camera module. In the arrangement of such components, a hole for transmitting external sound to the microphone module may be formed in the camera housing that protects the camera module. This hole is visible from the outside through the camera housing and may act as an aesthetic weakness of the electronic device. In particular, because a hole is formed in the window included in the camera housing, the manufacturing cost may increase.

In addition, because of the space occupied by the microphone module disposed adjacent to the enlarged camera module, the space in which the printed circuit board of the electronic device can be disposed may be reduced.

As the number and size of electronic components disposed on the printed circuit board increase and electronic devices become smaller, the area in which the electronic components may be disposed on the printed circuit board is gradually decreasing. In this situation, if the space in which the printed circuit board is arranged is reduced by the camera module and the microphone module, it may be difficult to design the electronic device.

SUMMARY

Embodiments of the disclosure provide an electronic device including a microphone device disposed adjacent to a camera device.

An electronic device according to various example embodiments disclosed herein may comprise: a camera module including at least one camera, a camera housing disposed to cover the camera module in a first direction, a microphone module including at least one microphone disposed in the camera housing in a second direction opposite to the first direction, a first path formed in the camera housing in a third direction perpendicular to the first direction and the second direction, and a second path formed in the camera housing to connect the first path and the microphone module.

A microphone structure according to various example embodiments disclosed herein may comprise: a microphone module including at least one microphone, a conduit formed in a camera housing disposed in a first direction with respect to the microphone module to cover the camera module disposed adjacent to the microphone module configured to transmit external sound to the microphone module, and a printed circuit board at least a portion of which is disposed in a second direction opposite to the first direction with respect to the microphone module and to which the microphone module is electrically connected, wherein the conduit structure may comprise, a first path formed in the camera housing in a third direction perpendicular to the first direction and the second direction, and a second path connecting the first path and the microphone module.

An electronic device according to various example embodiments disclosed herein may comprise: a camera module including at least one camera, a microphone module including at least one microphone, a camera housing disposed to cover the camera module and the microphone module, a cover at least a portion of which is disposed adjacent to the camera housing and disposed to cover one surface of the electronic device, a first path formed in the camera housing at a portion where the camera housing and the cover member face each other, and a second path formed in the camera housing to connect the first path and the microphone module.

According to various example embodiments, external sound may be transmitted to the microphone module without a hole having been formed in the window included in the camera housing. Therefore, the aesthetics of the electronic device may be improved, and the manufacturing cost may be reduced.

In addition, even if the microphone module is disposed in the camera housing, it is possible to secure a space for the printed circuit board to be disposed.

BRIEF DESCRIPTION OF THE DRAWINGS

The above and other aspects, features and advantages of certain embodiments of the present disclosure will be more apparent from the following detailed description, taken in conjunction with the accompanying drawings, in which.

In connection with the description of the drawings, the same or similar reference numerals may be used for the same or similar components.

DETAILED DESCRIPTION

Figure 1A:
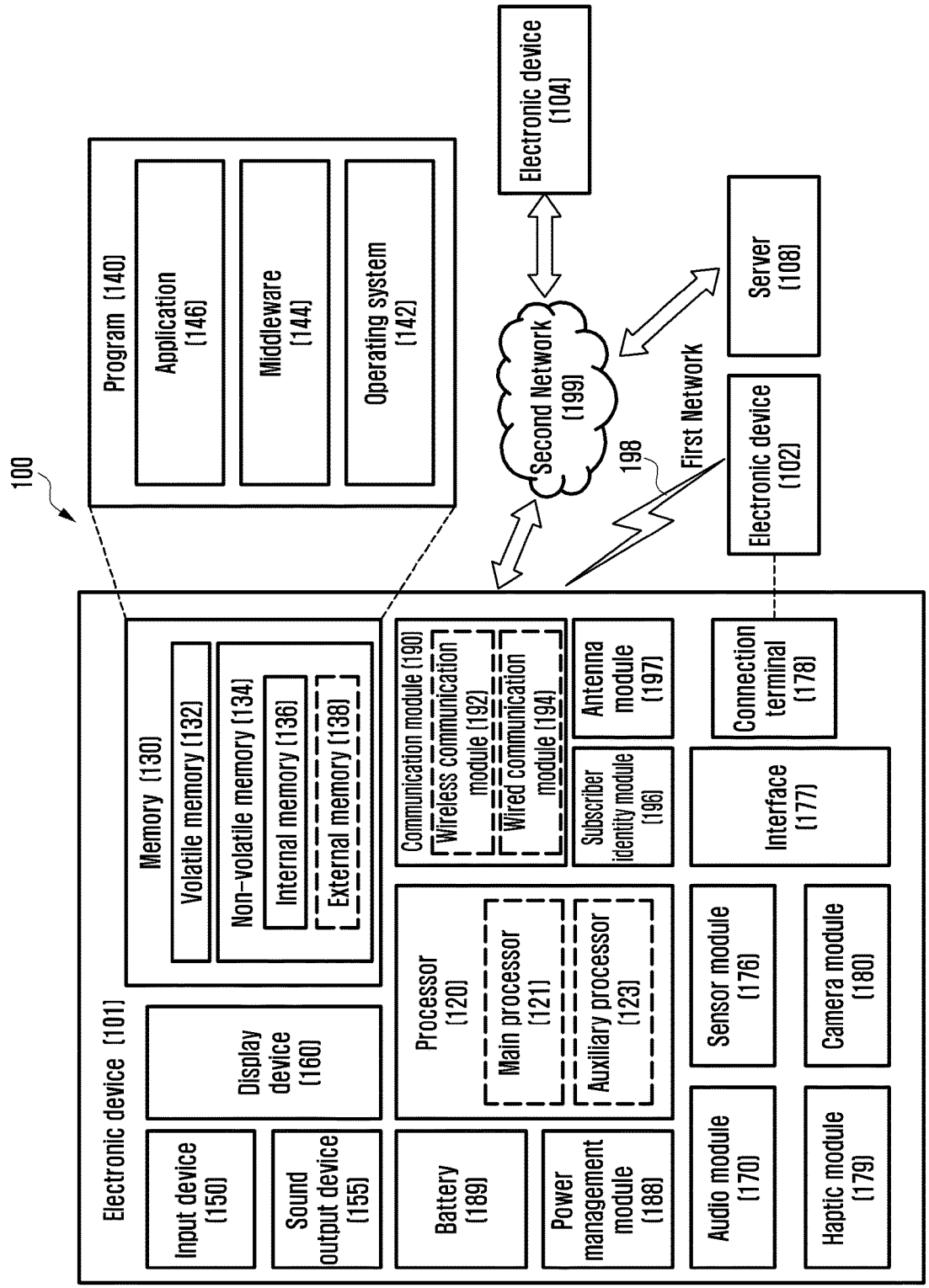
FIG. 1A is a block diagram of illustrating an example electronic device in a network environment according to various embodiments.

It should be appreciated that various embodiments of the present disclosure and the terms used therein are not intended to limit the technological features set forth herein to particular embodiments and include various changes, equivalents, or replacements for a corresponding embodiment.

With regard to the description of the drawings, similar reference numerals may be used to refer to similar or related elements. It is to be understood that a singular form of a noun corresponding to an item may include one or more of the things, unless the relevant context clearly indicates otherwise.

As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

FIG. 1A is a block diagram illustrating an example electronic device 101 in a network environment 100 according to various embodiments. Referring to FIG. 1A, the electronic device 101 in the network environment 100 may communicate with an electronic device 102 via a first network 198 (e.g., a short-range wireless communication network), or at least one of an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various embodiments, at least one of the components (e.g., the connecting terminal 178) may be omitted from the electronic device 101, or one or more other components may be added in the electronic device 101. In various embodiments, some of the components (e.g., the sensor module 176, the camera module 180, or the antenna module 197) may be implemented as a single component (e.g., the display module 160).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may store a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. According to an embodiment, the auxiliary processor 123 (e.g., the neural processing unit) may include a hardware structure specified for artificial intelligence model processing. An artificial intelligence model may be generated by machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment, the display module 160 may include a touch sensor adapted to detect a touch, or a pressure sensor adapted to measure the intensity of force incurred by the touch.

The audio module 170 may convert a sound into an electrical signal and vice versa. According to an embodiment, the audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth, wireless-fidelity (Wi-Fi) direct, or infrared data association (IrDA)) or the second network 199 (e.g., a long-range communication network, such as a legacy cellular network, a 5G network, a next-generation communication network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the electronic device 104), or a network system (e.g., the second network 199). According to an embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an embodiment, the antenna module 197 may include an antenna including a radiating element including a conductive material or a conductive pattern formed in or on a substrate (e.g., a printed circuit board (PCB)). According to an embodiment, the antenna module 197 may include a plurality of antennas (e.g., array antennas). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

According to various embodiments, the antenna module 197 may form a mmWave antenna module. According to an embodiment, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 or 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In an embodiment, the external electronic device 104 may include an internet-of-things (IoT) device. The server 108 may be an intelligent server using machine learning and/or a neural network. According to an embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

Figure 1B:
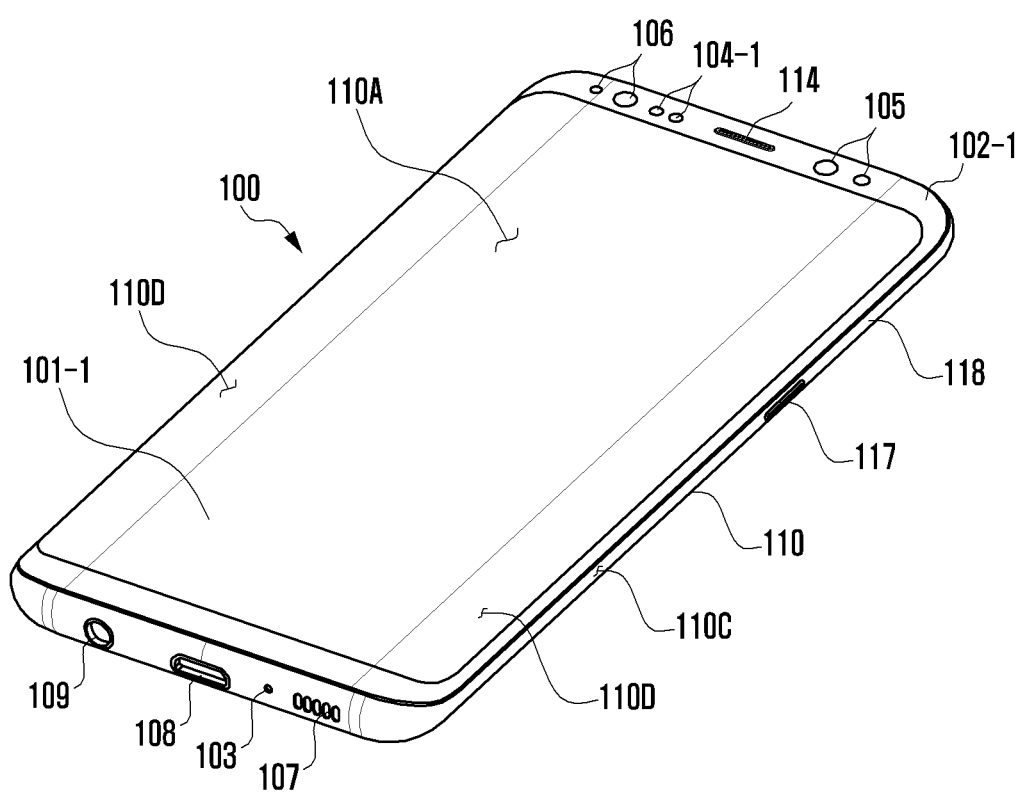
FIG. 1B is a front perspective view of a mobile electronic device according to various embodiments.
Figure 1C:
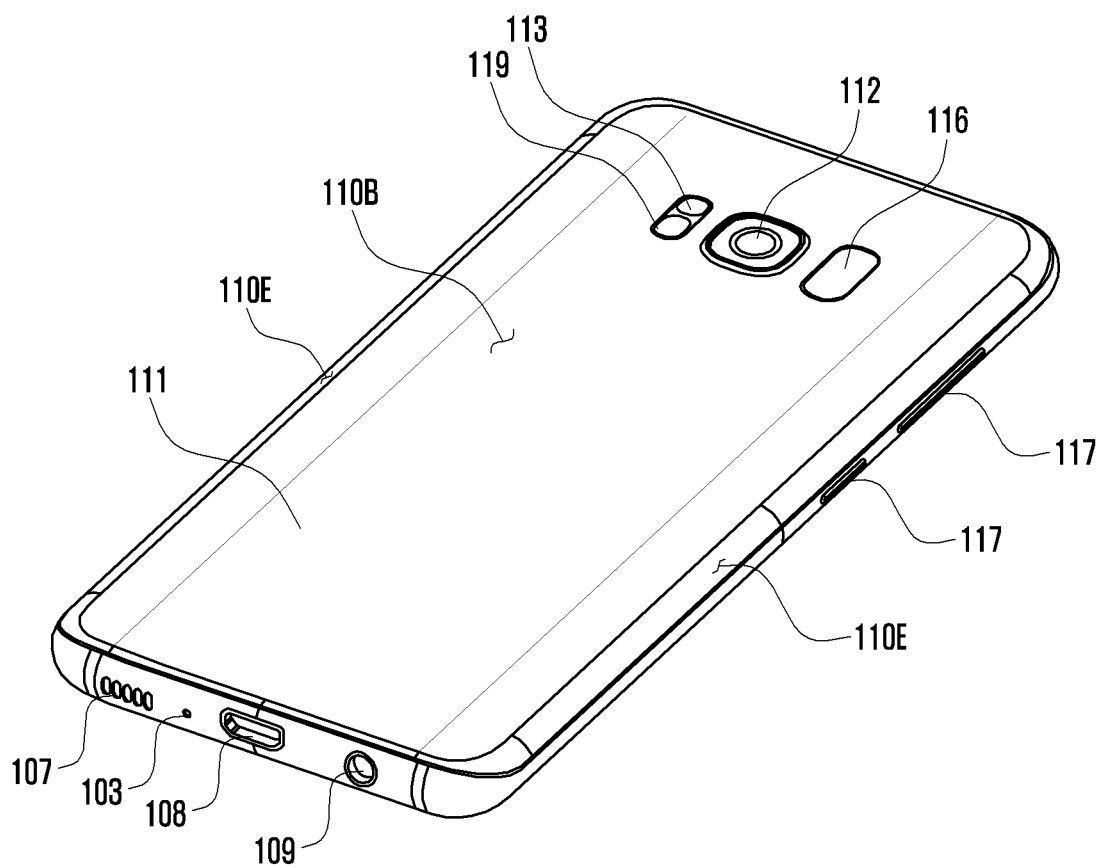
FIG. 1C is a rear perspective view of the electronic device of FIG. 1B according to various embodiments.

Referring to FIGS. 1B and 1C, according to an embodiment, an electronic device 100 may include a housing 110 that includes a first surface (or front surface) 110A, a second surface (or rear surface) 110B, and a lateral surface 110C that surrounds a space between the first surface 110A and the second surface 110B. According to an embodiment, the housing 110 may refer to a structure that forms a part of the first surface 110A, the second surface 110B, and the lateral surface 110C. According to an embodiment, the first surface 110A may be formed of a front plate 102-1 (e.g., a glass plate or polymer plate coated with a variety of coating layers) at least a part of which is substantially transparent. The second surface 110B may be formed of a rear plate 111 which is substantially opaque. The rear plate 111 may be formed of, for example, coated or colored glass, ceramic, polymer, metal (e.g., aluminum, stainless steel (STS), or magnesium), or any combination thereof. The lateral surface 110C may be formed of a lateral bezel structure (or "lateral member") 118 which is combined with the front plate 102-1 and the rear plate 111 and includes a metal and/or polymer. The rear plate 111 and the lateral bezel structure 118 may be integrally formed and may be of the same material (e.g., a metallic material such as aluminum).

In the shown embodiment, the front plate 102-1 may include two first regions 110D disposed at long edges thereof, respectively, and bent and extended seamlessly from the first surface 110A toward the rear plate 111. In the shown embodiment, the rear plate 111 may include two second regions 110E disposed at long edges thereof, respectively, and bent and extended seamlessly from the second surface 110B toward the front plate 102-1 (refer to FIG. 1B). In various embodiments, the front plate 102-1 (or the rear plate 111) may include only one of the first regions 110D (or of the second regions 110E). In various embodiments, the first regions 110D or the second regions 110E may be omitted in part. In the embodiments, when viewed from a lateral side of the electronic device 100, the lateral bezel structure 118 may have a first thickness (or width) on a lateral side where one of the first regions 110D or one of the second regions 110E is not included, and may have a second thickness, being less than the first thickness, on another lateral side where one of the first regions 110D or one of the second regions 110E is included.

According to an embodiment, the electronic device 100 may include at least one of a display 101, audio modules 103, 107 and 114, sensor modules 104-1, 116 and 119, camera modules 105, 112 and 113, key input devices 117, a light emitting device 106, and connector holes 108 and 109. In various embodiments, the electronic device 100 may omit at least one (e.g., the key input devices 117 or the light emitting device 106) of the above components, or may further include other components.

The display 101 may be exposed through a substantial portion of the front plate 102-1, for example. In various embodiments, at least a part of the display 101 may be exposed through the front plate 102-1 that forms the first surface 110A and the first regions 110D. In various embodiments, outlines (i.e., edges and corners) of the display 101 may have substantially the same form as those of the front plate 102-1. In an embodiment (not shown), the spacing between the outline of the display 101 and the outline of the front plate 102-1 may be substantially unchanged in order to enlarge the exposed area of the display 101.

In an embodiment (not shown), a recess or opening may be formed in a portion of a display area of the display 101 to accommodate at least one of the audio modules (e.g., the audio module 114), the sensor module 104-1, the camera module 105, and the light emitting device 106. In an embodiment (not shown), at least one of the audio modules (e.g., the audio module 114), the sensor module 104-1, the camera module 105, the sensor module 116 (e.g., a fingerprint sensor), and the light emitting device 106 may be disposed on the back of the display area of the display 101. In an embodiment (not shown), the display 101 may be combined with, or adjacent to, a touch sensing circuit, a pressure sensor capable of measuring the touch strength (pressure), and/or a digitizer for detecting a stylus pen. In various embodiments, at least a part of the sensor modules 104-1 and 119 and/or at least a part of the key input devices 117 may be disposed in one of the first regions 110D and/or one of the second regions 110E.

The audio modules 103, 107 and 114 may correspond to a microphone hole (e.g., the audio module 103) and speaker holes (e.g., the audio modules 107 and 114). The microphone hole may contain a microphone disposed therein for acquiring external sounds and, in a case, contain a plurality of microphones to sense a sound direction. The speaker holes may be classified into an external speaker hole and a call receiver hole. In various embodiments, the microphone hole and the speaker holes may be implemented as a single hole, or a speaker (e.g., a piezo speaker) may be provided without the speaker holes.

The sensor modules 104-1, 116 and 119 may generate electrical signals or data corresponding to an internal operating state of the electronic device 100 or to an external environmental condition. The sensor modules 104-1, 116 and 119 may include a first sensor module (e.g., the sensor module 104-1) (e.g., a proximity sensor) and/or a second sensor module (e.g., a fingerprint sensor) disposed on the first surface 110A of the housing 110, and/or a third sensor module (e.g., the sensor module 119) (e.g., a heart rate monitor (HRM) sensor) and/or a fourth sensor module (e.g., the sensor module 116) (e.g., a fingerprint sensor) disposed on the second surface 110B of the housing 110. The fingerprint sensor may be disposed on the second surface 110B as well as the first surface 110A (e.g., the display 101) of the housing 110. The electronic device 100 may further include at least one of a gesture sensor, a gyro sensor, an air pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 105, 112 and 113 may include a first camera device (e.g., the camera module 105) disposed on the first surface 110A of the electronic device 100, and a second camera device (e.g., the camera module 112) and/or a flash (e.g., the camera module 113) disposed on the second surface 110B. The camera module 105 or the camera module 112 may include one or more lenses, an image sensor, and/or an image signal processor. The flash may include, for example, a light emitting diode or a xenon lamp. In various embodiments, two or more lenses (infrared cameras, wide angle and telephoto lenses) and image sensors may be disposed on one side of the electronic device 100.

The key input devices 117 may be disposed on the lateral surface 110C of the housing 110. In an embodiment, the electronic device 100 may not include some or all of the key input devices 117 described above, and the key input devices 117 which are not included may be implemented in another form such as a soft key on the display 101. In various embodiments, the key input devices 117 may include the sensor module 116 disposed on the second surface 110B of the housing 110.

The light emitting device 106 may be disposed on the first surface 110A of the housing 110, for example. For example, the light emitting device 106 may provide status information of the electronic device 100 in an optical form. In various embodiments, the light emitting device 106 may provide a light source associated with the operation of the camera module 105. The light emitting device 106 may include, for example, a light emitting diode (LED), an infrared (IR) LED, or a xenon lamp.

The connector holes 108 and 109 may include a first connector hole (e.g., the connector hole 108) adapted for a connector (e.g., a universal serial bus (USB) connector) for transmitting and receiving power and/or data to and from an external electronic device, and/or a second connector hole (e.g., the connector hole 109) adapted for a connector (e.g., an earphone jack) for transmitting and receiving an audio signal to and from an external electronic device.

Figure 1D:
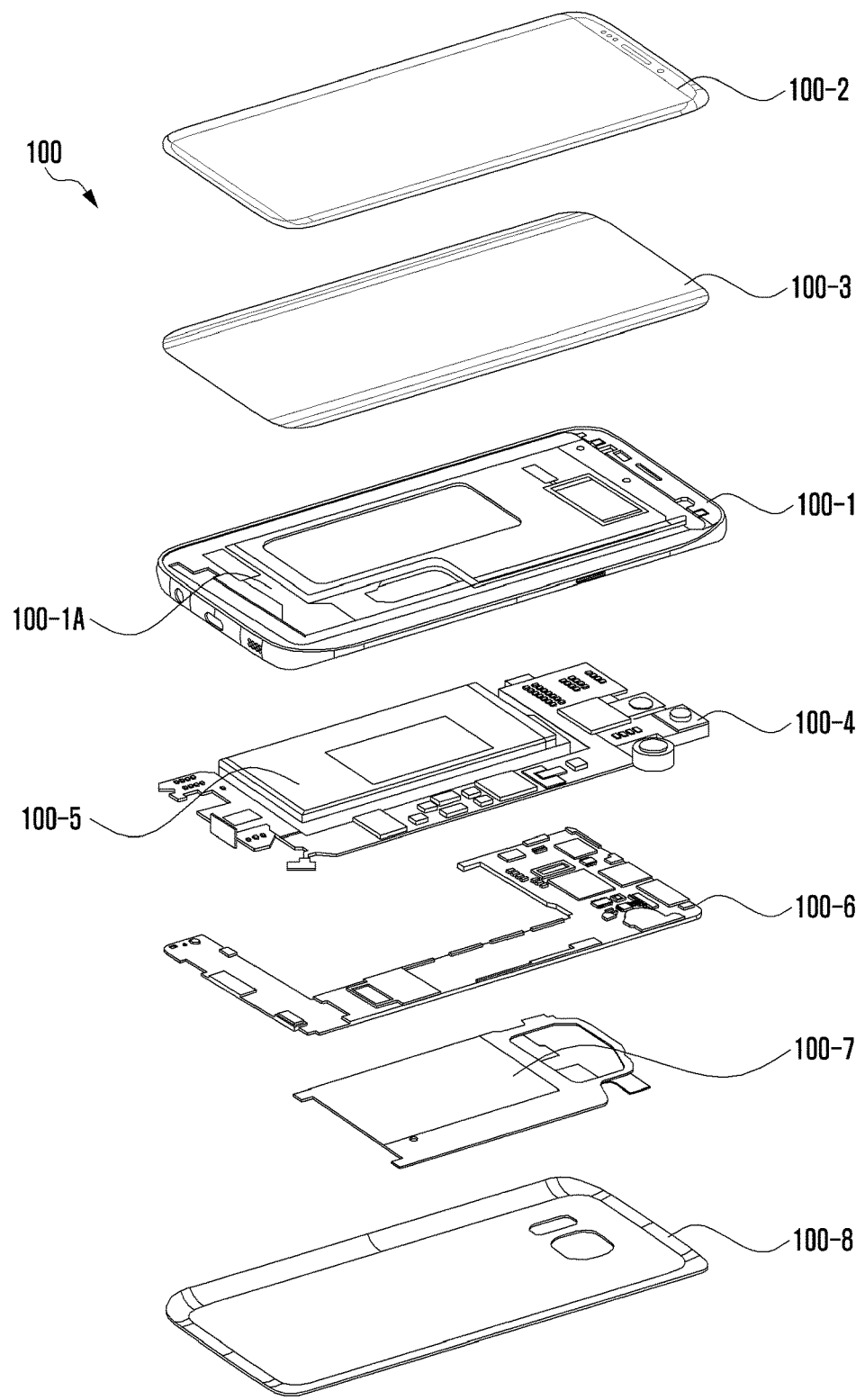
FIG. 1D is an exploded perspective view of the electronic device of FIG. 1B according to various embodiments.

Referring to FIG. 1D, an electronic device 100 (e.g., the electronic device 100 of FIG. 1) may include a lateral bezel structure 100-1, a first support member 100-1A (e.g., a bracket), a front plate 100-2, a display 100-3 (e.g., the display 101), a printed circuit board (PCB) 100-4, a battery 100-5, a second support member 100-6 (e.g., a rear case), an antenna 100-7, and a rear plate 100-8. In various embodiments, the electronic device 100 may omit at least one (e.g., the first support member 100-1A or the second support member 100-6) of the above components or may further include another component. Some components of the electronic device 100 may be the same as or similar to those of the electronic device 100 shown in FIG. 1B or FIG. 1C, thus, descriptions thereof are omitted below.

The first support member 100-1A is disposed inside the electronic device 100 and may be connected to, or integrated with, the lateral bezel structure 100-1. The first support member 100-1A may be formed of, for example, a metallic material and/or a non-metal (e.g., polymer) material. The first support member 100-1A may be combined with the display 100-3 at one side thereof and also combined with the PCB 100-4 at the other side thereof. On the PCB 100-4, a processor, a memory, and/or an interface may be mounted. The processor may include, for example, one or more of a central processing unit (CPU), an application processor (AP), a graphics processing unit (GPU), an image signal processor (ISP), a sensor hub processor, or a communications processor (CP).

The memory may include, for example, volatile memory or non-volatile memory.

The interface may include, for example, a high definition multimedia interface (HDMI), a USB interface, a secure digital (SD) card interface, and/or an audio interface. The interface may electrically or physically connect the electronic device 100 with an external electronic device and may include a USB connector, an SD card/multimedia card (MMC) connector, or an audio connector.

The battery 100-5 is a device for supplying power to at least one component of the electronic device 100, and may include, for example, a non-rechargeable primary battery, a rechargeable secondary battery, or a fuel cell. At least a part of the battery 100-5 may be disposed on substantially the same plane as the PCB 100-4. The battery 100-5 may be integrally disposed within the electronic device 100, and may be detachably disposed from the electronic device 100.

The antenna 100-7 may be disposed between the rear plate 100-8 and the battery 100-5. The antenna 100-7 may include, for example, a near field communication (NFC) antenna, a wireless charging antenna, and/or a magnetic secure transmission (MST) antenna. The antenna 100-7 may perform short-range communication with an external device, or transmit and receive power required for charging wirelessly. An antenna structure may be formed by a part or combination of the lateral bezel structure 100-1 and/or the first support member 100-1A.

In the following description, the same reference numerals are used for identical or similar components, except where otherwise indicated. In addition, descriptions of the same reference numerals may not be repeated.

Figure 2A:
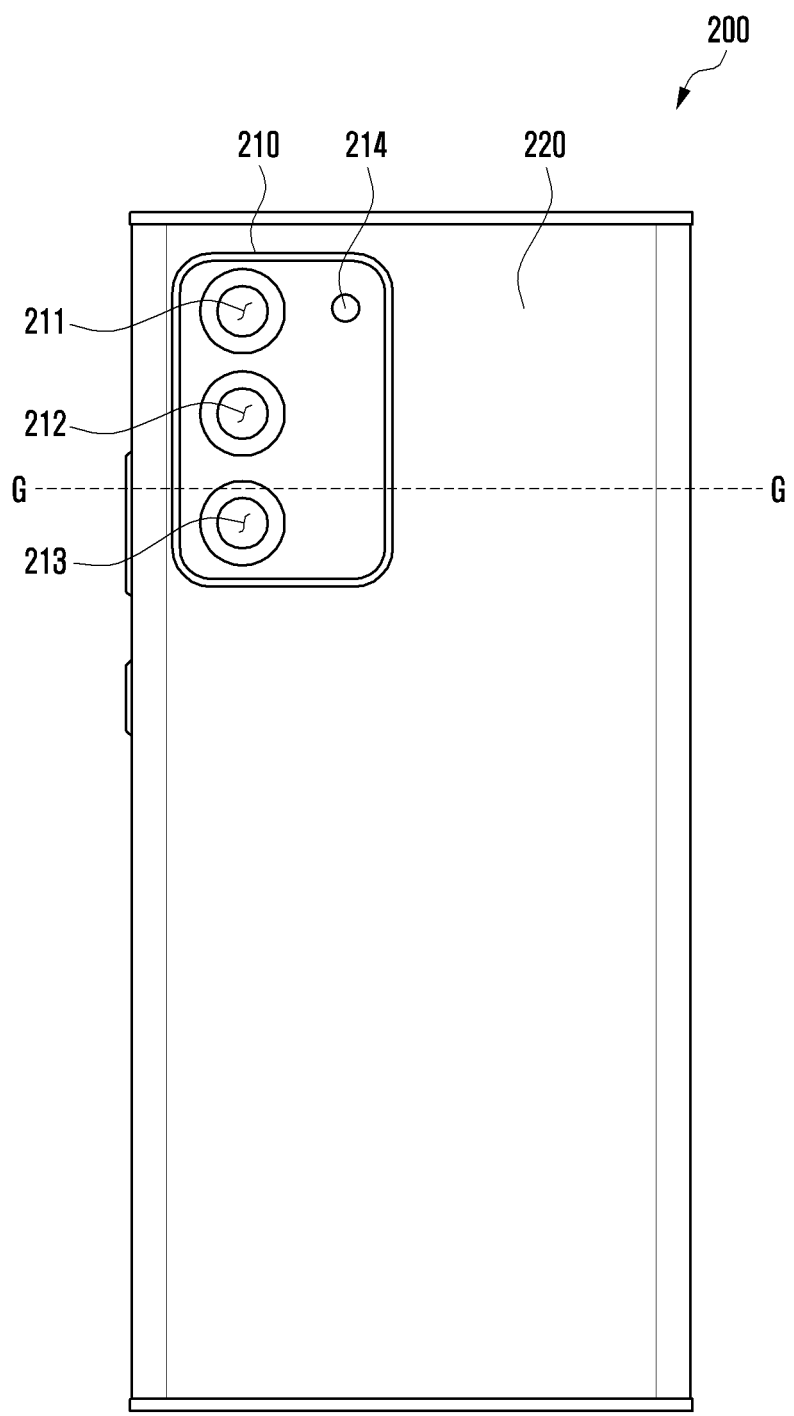
FIG. 2A is a diagram illustrating a rear side of an electronic device according to various embodiments.
Figure 2B:
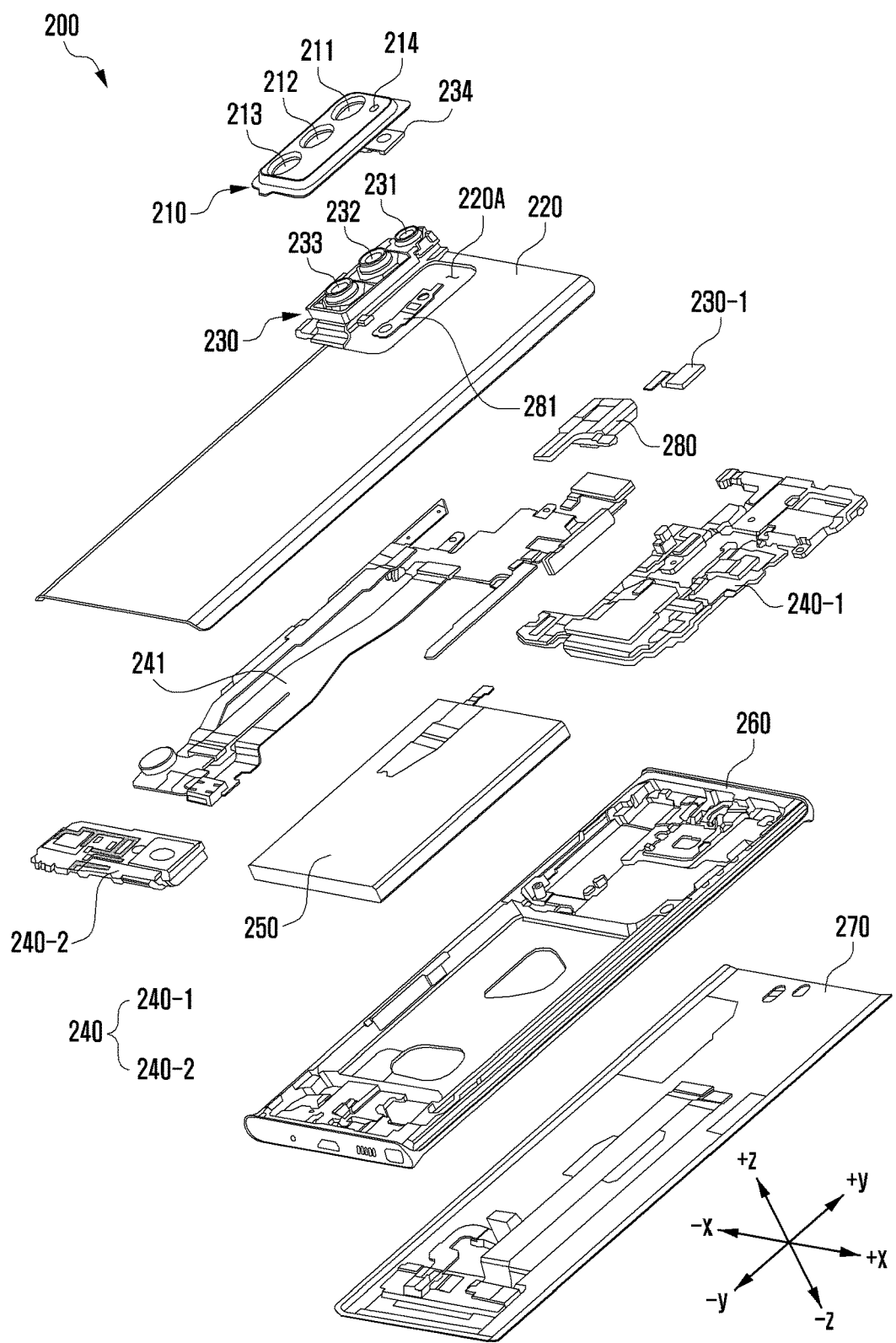
FIG. 2B is an exploded perspective view of the electronic device shown in FIG. 2A according to various embodiments.

FIG. 2A is a diagram illustrating a rear of an electronic device according to various embodiments. FIG. 2B is an exploded perspective view of the electronic device shown in FIG. 2A according to various embodiments.

The electronic device 200 shown in FIGS. 2A and 2B may be the electronic device 101 described in FIG. 1A or the electronic device 100 described in FIGS. 1B, 1C and 1D. The electronic device 200 shown in FIGS. 2A and 2B is only one of various examples of the electronic device 200, and neither the shape nor the arrangement of the components of the electronic device 200 is limited by the electronic device 200 shown in FIGS. 2A and 2B.

According to various embodiments, the camera housing 210 and the cover member 220 may be disposed on the rear surface of the electronic device 200. The rear surface of the electronic device 200 may refer to a surface facing the +Z direction (hereinafter, referred to as a "first direction") with reference to FIG. 2B. The camera housing 210 may be a housing disposed to cover the camera module 230, and the cover member 220 may be a housing disposed to cover the rear surface of the electronic device 200 except for a portion occupied by the camera housing 210. As shown in FIGS. 2A and 2B, a portion of the cover member 220 may be adjacent to the camera housing 210. For example, an opening 220A into which the camera housing 210 may be inserted may be formed in the cover member 220. The camera housing 210 may be seen from the rear of the electronic device 200 through the opening 220A formed in the cover member 220.

As shown in FIGS. 2A and 2B, the camera housing 210 may include a plurality of holes (211, 212, 213, 214). The holes 211, 212, 213, and 214 of the camera housing 210 may refer, for example, to holes formed in the body (e.g., the body 217 of FIG. 3B) among the components of the camera housing 210 described in FIGS. 3A and 3B (e.g., the holes 217-1, 217-2, 217-3, and 217-4 of FIG. 3B), and the adhesive member (e.g., the adhesive member 216 of FIG. 3B) (e.g., the hole 216 of FIG. 3B (216-1, 216-2, 216-3, 216-4)) is a portion recognized as a window member (e.g., the window member 215 of FIG. 3B). The holes 211, 212, 213, and 214 formed in the camera housing 210 may correspond to components that receive external light or emit light to the outside among components of the camera module 230. The camera module 230 may include a plurality of cameras 231, 232, and 233 having different performances. Here, performance may be understood as a concept including the specifications of the lens, sensor, aperture, and each component included in the camera and optical design factors such as focal length, angle of view, and total track (TTL), and black focal length (BFL) determined from the arrangement relationship between each component. For example, the plurality of cameras 231, 232, and 233 included in the camera module 230 may be cameras capable of photographing different angles of view (e.g., a wide angle, a telescopic angle, etc.).

In an embodiment, the camera module 230 may include, for example, three cameras (231, 232, 233). Among the plurality of holes 211, 212, 213 and 214 of the camera housing 210, the first hole 211 may correspond to the first camera 231, the second hole 212 may correspond to the second camera 232, and the third hole 213 may correspond to the third camera 233. A fourth hole 214 of the plurality of holes 211, 212, 213, and 214 of the camera housing 210 may correspond to a light emitting device (e.g., a flash 234). The light emitting device 234 may be a device including a light emitting device (e.g., a light emitting diode (LED)) capable of generating light. The shape and number of the plurality of holes 211, 212, 213, and 214 formed in the camera housing 210 may be variously changed. As described above, because the plurality of holes 211, 212, 213, and 214 may be passages for receiving or emitting light, there may be changes in various ways depending on the number and the shape of components receiving or emitting light from the camera module 230. For example, when the camera module 230 includes one camera, only one hole may be formed in the camera housing 210, and when the camera module 230 includes four cameras and one light emitting device, a total of five holes may be formed in the camera housing 210.

According to various embodiments, the electronic device 200 may include a camera module 230, a microphone module 280, a printed circuit board 240 (e.g., 240-1, 240-2), a connection member 241, a battery 250, a main housing 260, or a display module 270 etc. The layout of the electronic device 200 shown in FIG. 2B is only an example, and the components of the electronic device 200 may be arranged in various ways within a range that a person skilled in the art can understand.

According to various embodiments, the main housing 260 may support the components of the electronic device 200 as a whole. The main housing 260 may be formed of various materials, and different parts may be formed of different materials. For example, the main housing 260 may be formed of a material such as synthetic resin or metal. The display module 270 may be disposed on the front surface of the main housing 260, and the cover member 220 may be disposed on the rear surface of the main housing 260. The front surface of the main housing 260 may refer to a −Z direction (hereinafter referred to as a "second direction") with reference to FIG. 2B.

According to various embodiments, various electronic components for operation of the electronic device 200 may be disposed on the printed circuit board 240. There may be a plurality of printed circuit boards 240 of the electronic device 200. For example, as shown in FIG. 2B, the printed circuit board 240 may include a first printed circuit board 240-1 and a second printed circuit board 240-2.

According to various embodiments, the connection member 241 may electrically connect the first printed circuit board 240-1 and the second printed circuit board 240-2. The connection member 241 may include various components capable of performing an electrical connection function. For example, the connection member 241 may include a flexible printed circuit board (FPCB). The first printed circuit board 240-1 and the second printed circuit board 240-2 may be electrically connected to each other through the connecting member 241, and an electronic component disposed on the first printed circuit board 240-1, and electronic components disposed on the second printed circuit board 240-2 may be electrically connected to each other.

According to various embodiments, the battery 250 may supply power for the operation of the electronic device 200. With reference to FIG. 3B, the battery 250 may be disposed between the first printed circuit board 240-1 and the second printed circuit board 240-2.

According to various embodiments, the camera module 230 may be connected to the printed circuit board 240. The electronic device 200 may include a plurality of camera modules 230 and 230-1. For example, the electronic device 200 may include a camera module 230 disposed on the rear side for photographing a first direction, and a front camera module 230-1 disposed on the front side for photographing a second direction. The camera module 230 may include a plurality of cameras 231, 232, and 233. For example, the camera module 230 may include a first camera 231 configured to perform photographing at a first angle of view, a second camera 232 configured to perform photographing at a second angle of view, and a third camera 233 configured to perform photographing at a third angle of view. The first angle of view, the second angle of view, and the third angle of view may all be different. For example, the first angle of view may be a wider angle of view than the second angle of view, and the third angle of view may be a smaller angle of view than the second angle of view. When the second angle of view is a standard angle of view, the first angle of view may be understood as a wide angle, and the third angle of view may be understood as a telephoto angle.

According to various embodiments, the microphone module 280 may be a device including at least one microphone for receiving an external sound. Although one microphone module 280 is illustrated in FIG. 2B, the electronic device 200 may include a plurality of microphone modules disposed at different positions. With reference to FIG. 2B, the microphone module 280 may be disposed adjacent to the camera module 230. The microphone module 280 may be, for example, at least partially disposed between the camera housing 210 and the first printed circuit board 240-1. In an embodiment, the microphone module 280 may include a microphone connector 281. The microphone connector 281 may electrically connect the microphone module 280 and the printed circuit boards 240-1 and 240-2 to each other. For example, the microphone connector 281 may include a flexible printed circuit board structure. In addition, the microphone connection unit 281 may include a structure for protecting the microphone module 280.

According to various embodiments, the cover member 220 may cover the rear surface of the electronic device 200 in the first direction. The camera module 230 may be visually recognized to the outside through the opening 220A formed in the cover member 220. The camera housing 210 may cover the camera module 230 in the first direction.

Figure 3A:
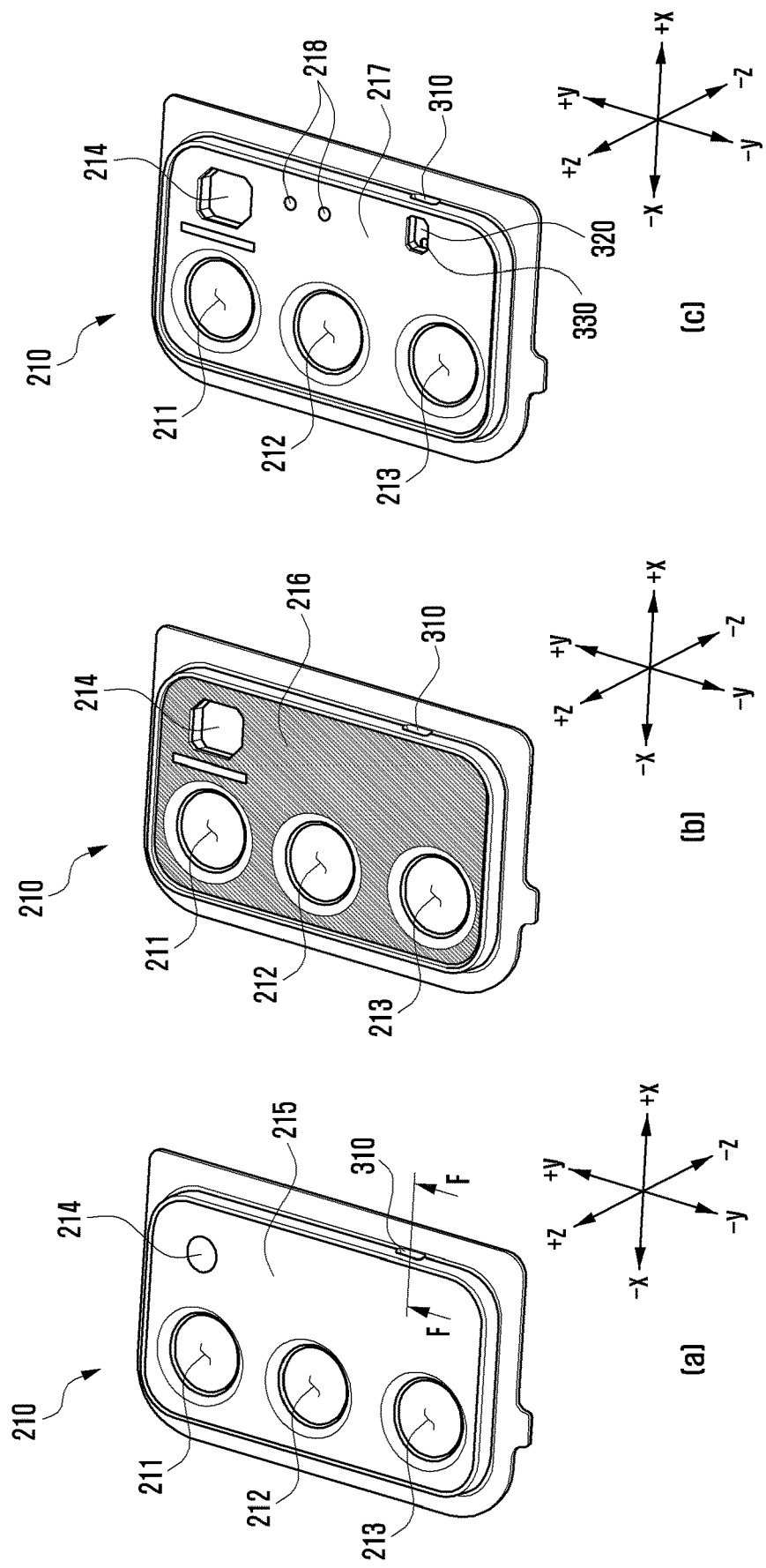
FIG. 3A is a perspective view of a camera housing according to various embodiments.
Figure 3B:
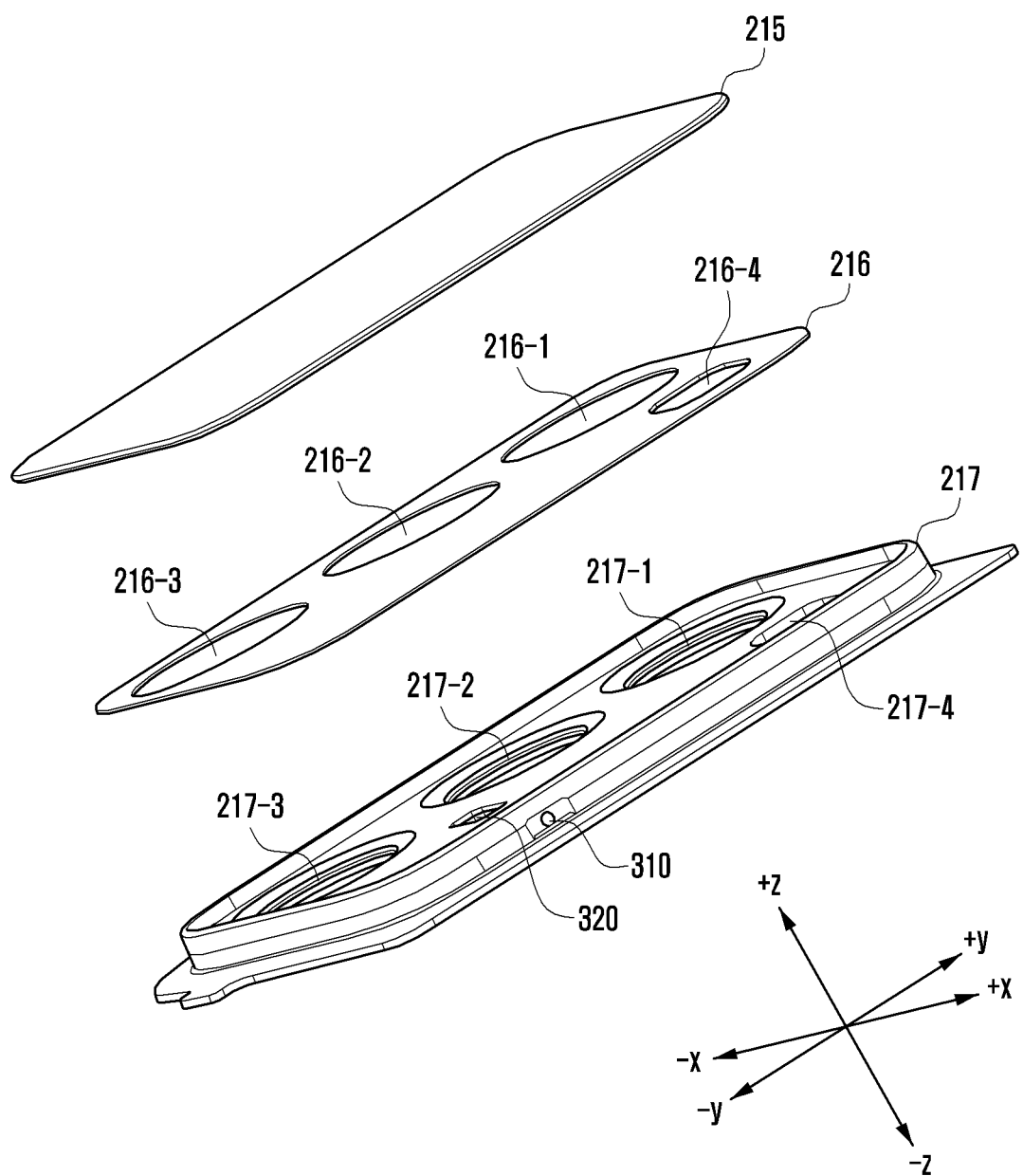
FIG. 3B is an exploded perspective view of the camera housing shown in FIG. 3A according to various embodiments.
Figure 3C:
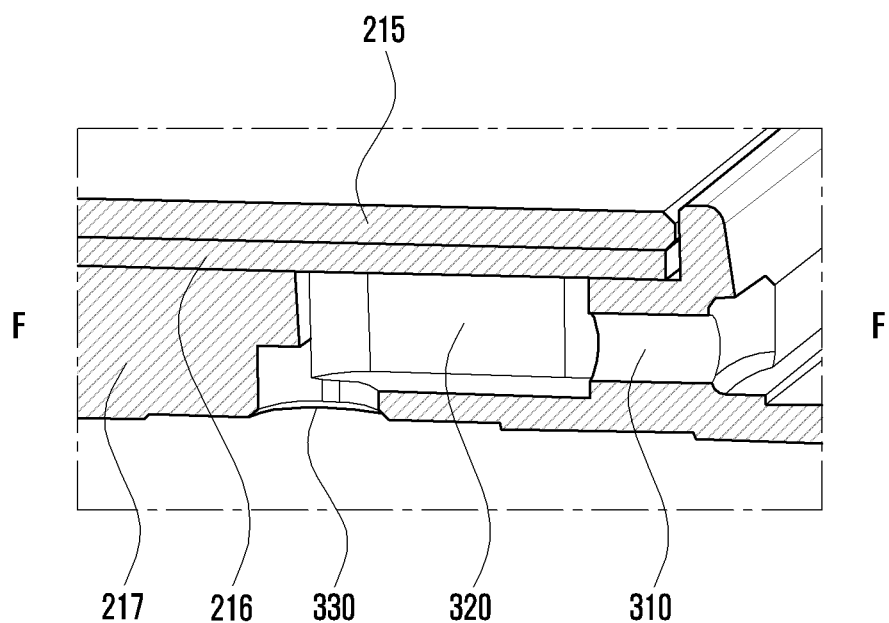
FIG. 3C is a sectional perspective view illustrating a cross-section of FIG. 3A (a) taken along the line F-F according to various embodiments.
Figure 3C:
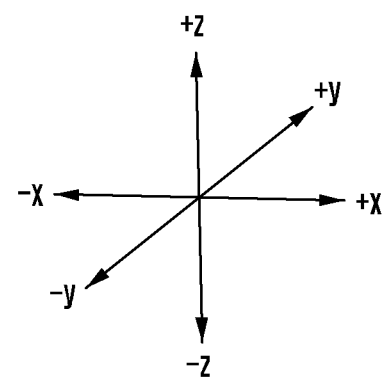

FIG. 3A is a perspective view of a camera housing according to various embodiments. FIG. 3B is an exploded perspective view of the camera housing shown in FIG. 3A according to various embodiments. FIG. 3C is a sectional perspective view illustrating a cross-section taken along line F-F of FIG. 3A (a) according to various embodiments.

FIG. 3A (a) is a perspective view of a state including the body 217, the adhesive member 216 and the window member 215, FIG. 3A (b) is a perspective view of a state in which the window member 215 is removed and FIG. 3A(c) is a perspective view of a state in which the window member 215 and the adhesive member 216 are removed.

According to various embodiments, the camera housing 210 may include a body 217, an adhesive member 216, and a window member 215. As shown in FIG. 3B, the camera housing 210 may include a structure in which a body 217—an adhesive member 216—a window member 215 are stacked in this order.

According to various embodiments, a first path 310 may be formed in the body 217. The first path 310 may be formed in the body 217 in a third direction (e.g., the X-axis direction of FIG. 3A). Here, the third direction is a direction perpendicular to both the first direction (e.g., the +Z direction of FIG. 3A) and the second direction (e.g., the −Z direction of FIG. 3A), and it may refer, for example, to a lateral direction of the body 217. In an embodiment, the first path 310 may be formed in the body 217 in a direction oblique with respect to the third direction. The size and shape of the first path 310 may be variously changed according to the specifications of the microphone module 280 included in the electronic device 200, the overall size of the camera housing 210, the size and shape of the conduit (e.g., the second path 320, the third path 330) formed in the camera housing 210 to transmit external sound to the microphone module 280, and the size and shape of the third path 330. The first path 310 formed in the third direction may be connected to the second path 320 formed in the camera housing 210. Through the first path 310, the second path 320 may be connected to the outside. The external sound of the electronic device may be introduced into the second path 320 through the first path 310. A plurality of holes 217-1, 217-2, 217-3 and 217-4 corresponding to the plurality of holes 211, 212, 213 and 214 of the camera housing 210 may be formed in the body 217. In an embodiment, as shown in FIG. 3A, a vent hole 218 connected to a microphone module (e.g., the microphone module 280 of FIG. 3B) may be formed in the body 217.

According to various embodiments, the adhesive member 216 may be disposed on the body 217. The adhesive member 216 may provide an adhesive force so that the window member 215 may be coupled to the body 217. In an embodiment, the adhesive member 216 may include a material having low light transmittance so that the body 217 is not viewed through the window member 215. A plurality of holes 216-1, 216-2, 216-3 and 216-4 corresponding to the plurality of holes 211, 212, 213 and 214 of the camera housing 210 may be formed in the adhesive member 216.

According to various embodiments, the window member 215 may be fixed on the body 217 by an adhesive member 216. At least a portion of the window member 215 may be formed of a material having high light transmittance. In an embodiment, the window member 215, which includes a plurality of holes 216-1, 216-2, and 216-3 formed in a portion corresponding to the cameras 231, 232, and 233

(e.g., the adhesive member 216) and a plurality of holes 217-1, 217-2, and 217-3 formed in the body 217, may have high light transmittance, and other portions may have low light transmittance. For example, a portion of the window member 215 may have an opaque layer or a translucent layer disposed thereon in various ways (e.g., coating, printing, etc.) so that transmittance to light is lowered. In an embodiment, the opaque layer or the translucent layer disposed on a portion of the window member 215 may be formed in the form of a film and laminated on the window member 215 by various thin film lamination methods. Since the first path 310 for receiving an external sound is formed in the lateral direction of the body 217, a hole may not be required in the window member 215.

According to various embodiments, when an external sound is introduced through the first path 310 formed in the body 217 in the third direction, the sound is transmitted to the second path 320 connected to the first path 310, and sound may be introduced into the microphone module (e.g., the microphone module 280 of FIG. 2B) facing the third path 330 through the third path 330 connected to the second path 320. The second path 320 may be, for example, a space formed by the adhesive member 216 closing the space formed in the body 217 in the first direction, as shown in FIG. 3C. Different from that shown in FIG. 3C, the second path 320 may be formed by the window member 215 closing the space formed in the body 217 in the first direction. In addition, the second path 320 may be formed only on the body 217 regardless of the adhesive member 216 or the window member 215.

According to various embodiments, a material having low light transmittance may be disposed in a portion adjacent to the first path 310 in the first path 310 and the second path 320. For example, the material having low light transmittance may be the same as or similar to the material applied to the adhesive member 216.

Figure 4A:
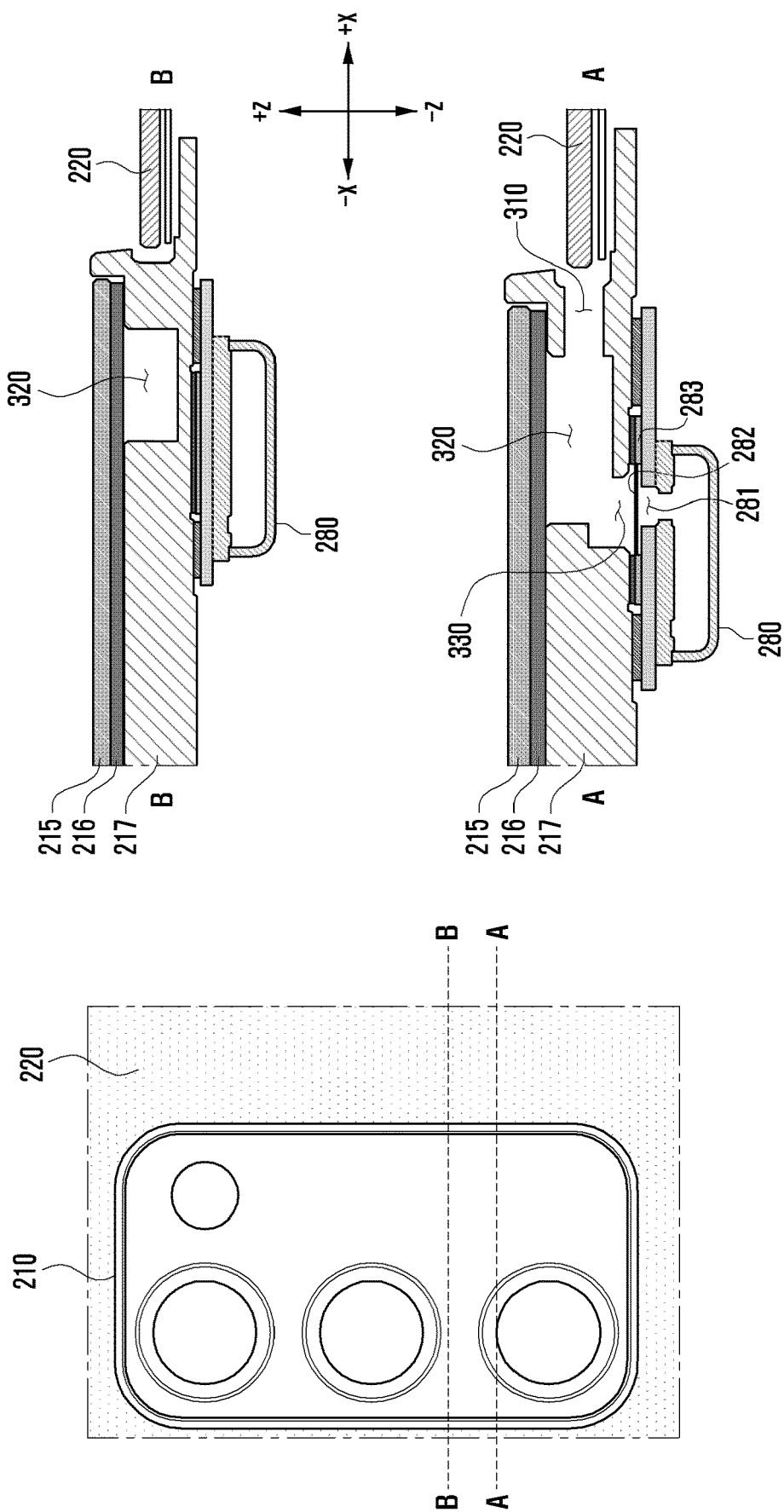
FIG. 4A is a diagram illustrating an example arrangement relationship of the camera housing and the microphone module according to various embodiments.

FIG. 4A is a diagram illustrating an example arrangement relationship of the camera housing and the microphone module according to various embodiments.

According to various embodiments, the camera housing 210 may be disposed adjacent to the cover member 220. The first path 310 formed in the camera housing 210 may be formed in the camera housing 210 at a portion where the camera housing 210 and the cover member 220 face each other.

For example, as shown in FIG. 4A, the first path 310 may be formed in a portion of the camera housing 210 facing the cover member 220. Although not shown in the drawings, in some cases, a groove may be formed in the cover member 220 facing the portion where the first path 310 is formed.

According to various embodiments, the second path 320 formed in the camera housing 210 may be connected to the first path 310. The second path 320 is a space formed in the body 217 of the camera housing 210 and may be a space formed by the adhesive member 216 covering the space formed in the body 217 as shown in FIG. 4A. Although not shown in the drawings, in some cases, the window member 215 rather than the adhesive member 216 may cover the space formed in the body 217 to form the second path 320.

According to various embodiments, the shapes of the first path 310 and the second path 320 may be variously changed. For example, according to the specification of the microphone module 280 for receiving external sound through the first path 310 and the second path 320, the shapes of the first path 310 and the second path 320 may be changed in various ways.

According to various embodiments, the microphone hole 281 of the microphone module 280 disposed in the camera housing 210 may be connected with the second path 320 through the third path 330 formed in the body 217. A mesh structure 282 and a waterproof member 283 may be placed between the microphone hole 281 and the third path 330 to prevent and/or reduce foreign substances and moisture that may be introduced through the first path 310 from moving into the electronic device.

According to various embodiments, acoustic characteristics received by the microphone module may vary depending on the shape of the conduit structure formed in the camera housing. Therefore, the shape of the conduit structure may be variously configured in consideration of various variables such as the specification of the microphone module, the frequency characteristics of the sound to be received, and the directionality of the sound to be received.

Figure 4B:
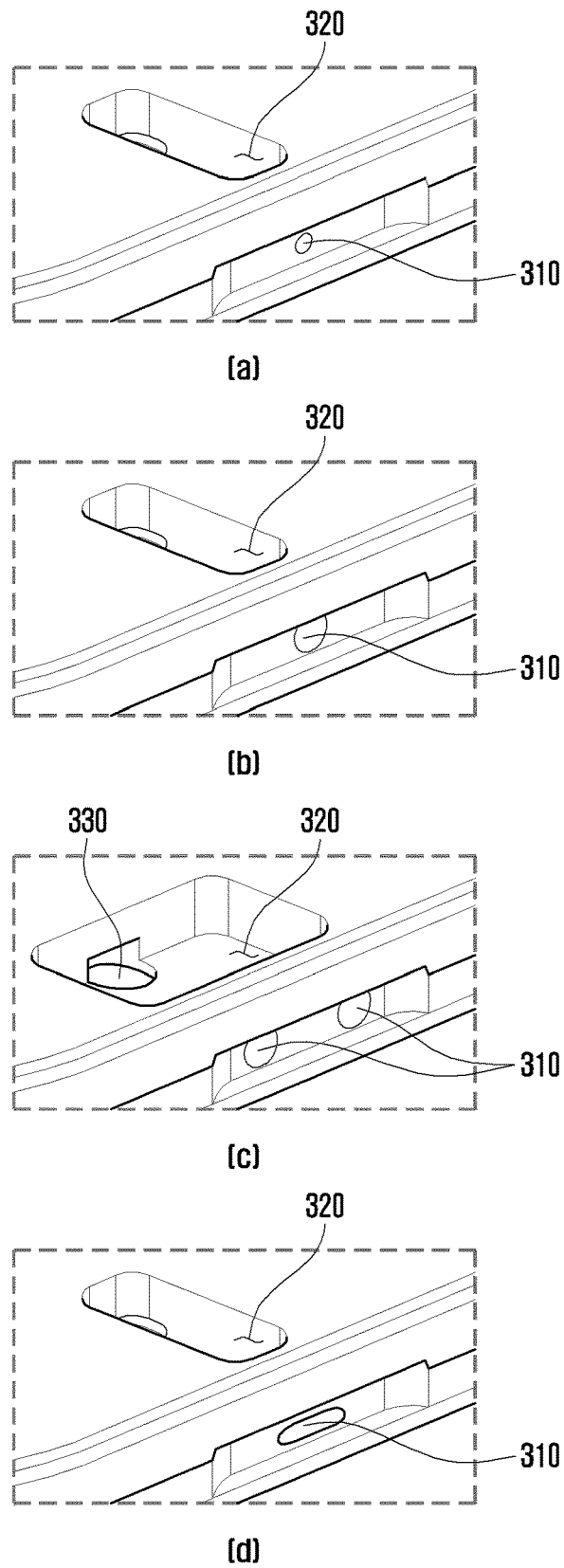
FIG. 4B is a diagram illustrating an example of various shapes of a conduit structure formed in a camera housing according to various embodiments.

FIG. 4B includes various diagrams illustrating examples of various shapes of the conduit structure formed in the camera housing according to various embodiments.

In an embodiment, the diameter or size of the first path may be changed. For example, the first path shown in (a) of FIG. 4B may have a smaller diameter or size than the first path shown in (b) of FIG. 4B.

In an embodiment, the shape of the first path may be changed. For example, as shown in (d) of FIG. 4B, the first path may have an elliptical shape.

In an embodiment, the number of first path may be changed. For example, as shown in (c) of FIG. 4B, there may be two first paths.

In an embodiment, the shape or volume of the second path may be changed. For example, the volume of the second path shown in (c) of FIG. 4B may be larger than the volume of the second path shown in (a) of FIG. 4B.

In addition, the shape of the conduit may be variously changed in consideration of the acoustic characteristics.

Figure 5:
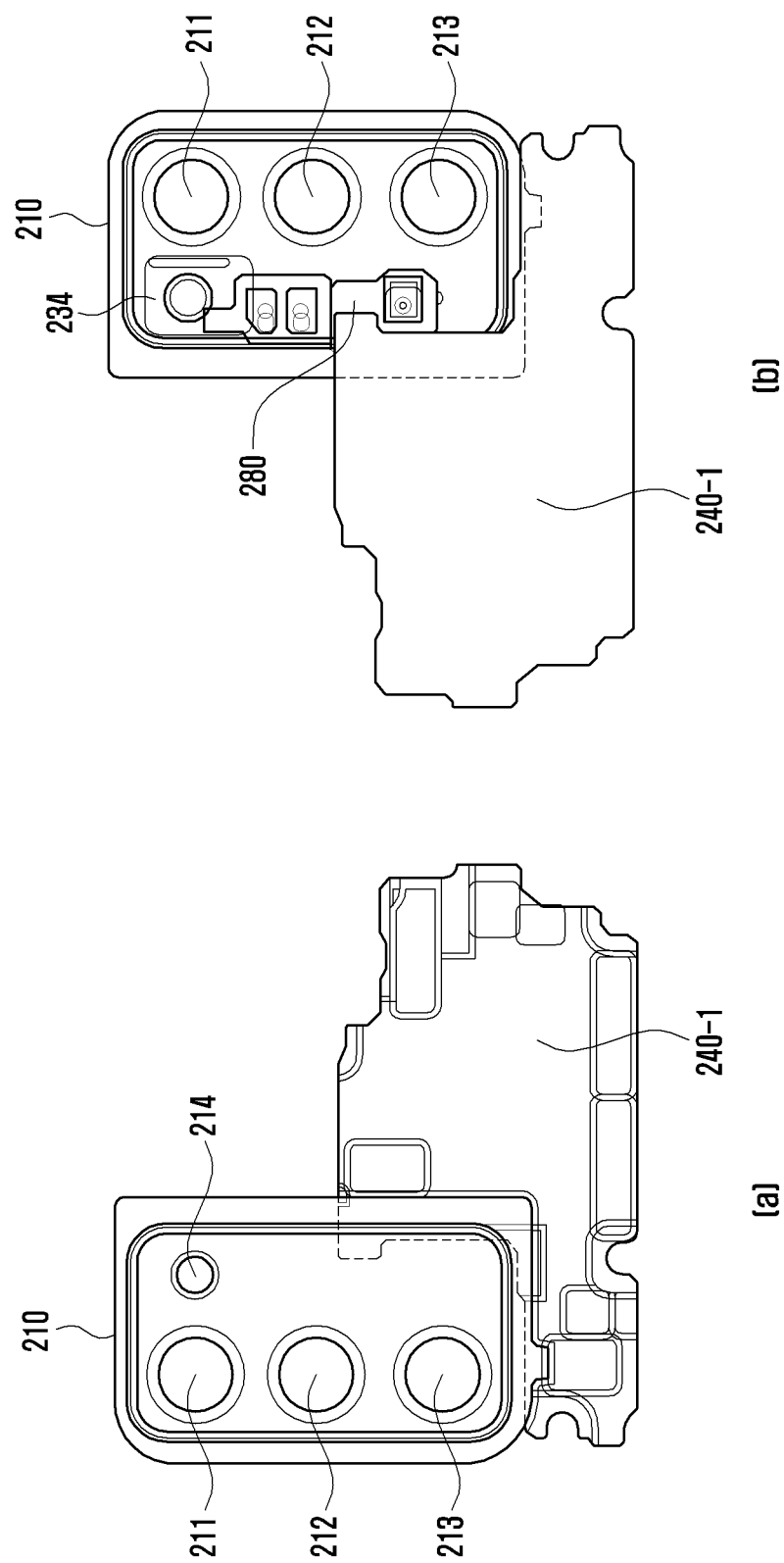
FIG. 5 is a diagram illustrating an example arrangement relationship between the camera housing and the printed circuit board according to various embodiments.
Figure 6:
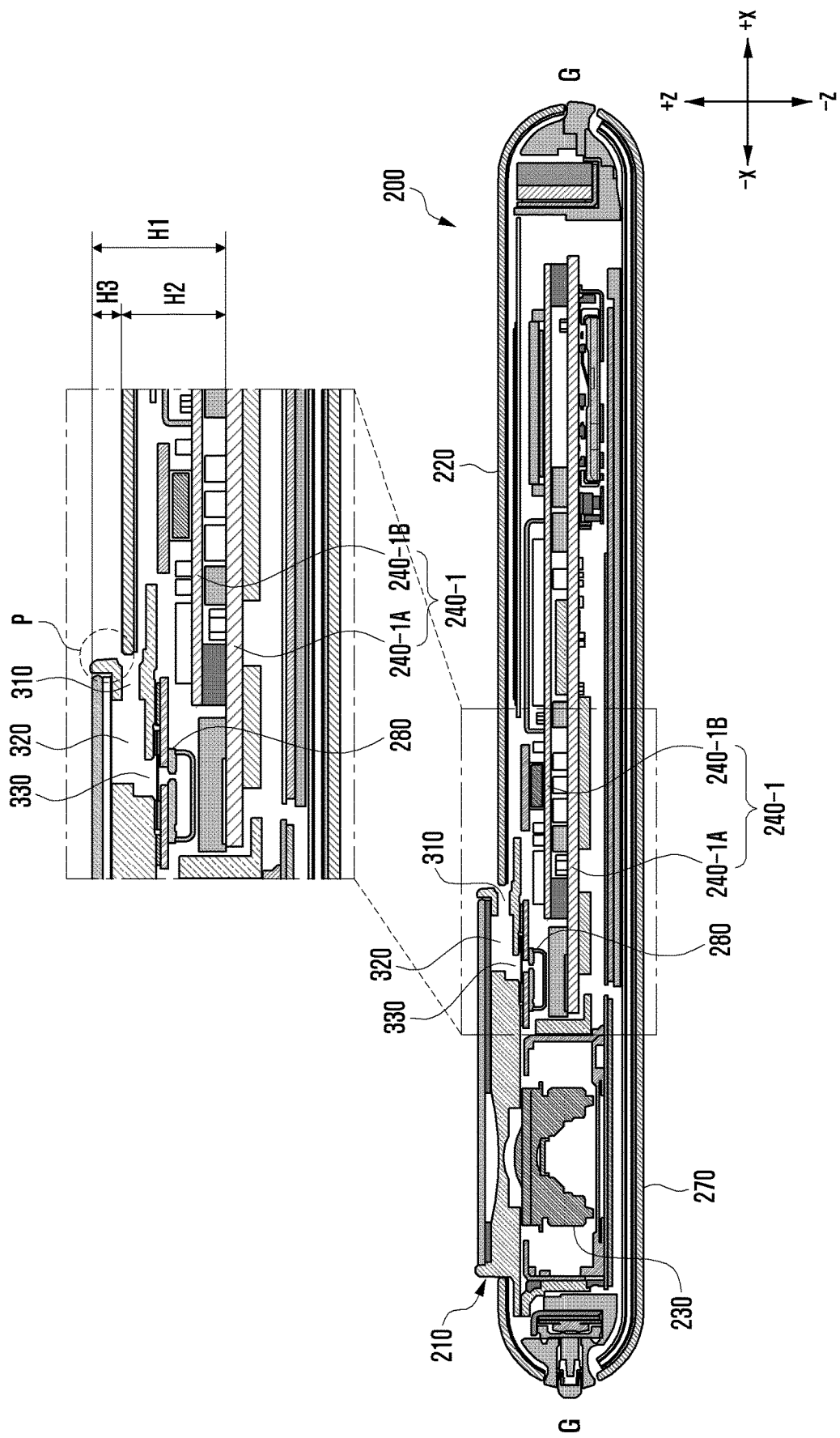
FIG. 6 is a cross-sectional view of the electronic device shown in FIG. 2A taken along line G-G according to various embodiments.

FIG. 5 is a diagram illustrating an example arrangement relationship between a camera housing and a printed circuit board according to various embodiments. FIG. 6 is a cross-sectional view of the electronic device shown in FIG. 2A taken along line G-G according to various embodiments.

According to various embodiments, the printed circuit board 240 may be disposed to be spaced apart from the camera housing 210 in the second direction (−Z direction in FIG. 6). The printed circuit board 240 may refer, for example, to the first printed circuit board 240-1 described with reference to FIG. 2B among the printed circuit boards 240 of the electronic device. In an embodiment, the first printed circuit board 240-1 may include a first sub printed circuit board 240-1A and a second sub printed circuit board 240-1B. The second sub printed circuit board 240-1B may be stacked in a first direction with respect to the first sub printed circuit board 240-1A. The first sub printed circuit board 240-1A and the second sub printed circuit board 240-1B may be interposed between the first sub printed circuit board 240-1A and the second sub printed circuit board 240-1B by a component capable of maintaining the spacing such as an interposer. Various electronic components may be disposed between the first sub printed circuit board 240-1A and the second sub printed circuit board 240-1B.

According to various embodiments, the first printed circuit board 240-1 may be disposed in the second direction (e.g., −Z direction in FIG. 6) also with respect to the microphone module 280. With reference to FIGS. 5B and 6, the microphone module 280 may be disposed between the camera housing 210 and the first printed circuit board 240-1.

According to various embodiments, as shown in FIG. 5, at least a portion of the first printed circuit board 240-1 may extend to a portion where the camera housing 210 is disposed. As described above, the camera housing 210 and the first printed circuit board 240-1 may overlap in a portion extending to the portion where the camera housing 210 is disposed. When the electronic device 200 is viewed in the first direction (e.g., the +Z direction of FIG. 6) or the second direction (e.g., the −Z direction of FIG. 6), a portion of the first printed circuit board 240-1 may overlap the camera housing 210. Since the first printed circuit board 240-1 may be disposed to overlap the camera housing 210, an area in which electronic components can be disposed on the first printed circuit board 240-1 may be increased.

According to various embodiments, as shown in FIG. 6, the distance H1 from the first printed circuit board 240-1 of the electronic device 200 to the end of the camera housing 210 may be greater than the distance H2 from the printed circuit board 240-1 to the end of the cover member 220. For example, the camera housing 210 may protrude more than the cover member 220 with respect to the first printed circuit board 240-1. As shown in FIG. 6, the camera housing 210 may protrude more than the cover member 220 in the first direction with respect to the first printed circuit board 240-1. In an embodiment, the thickness of the camera housing 210 is formed to be greater than the thickness of the cover member 220, and the camera housing 210 may include a protruding portion. The protrusion structure of the camera housing 210 may be because at least a portion of the camera module protected by the camera housing 210 protrudes more in the first direction than the cover member 220. Hereinafter, a portion of the camera housing 210 that protrudes more in the first direction than the cover member 220 will be described as a protruding portion P.

According to various embodiments, the first path 310 may be formed in the protruding portion P. The first path 310 may be formed in the protruding portion P of the camera housing 210 at a portion where the camera housing 210 and the cover member 220 face each other. The first path 310 may be connected to the second path 320 formed in the camera housing 210.

According to various embodiments, the microphone module 280 and the first printed circuit board 240-1 may be disposed in the second direction with respect to the camera housing 210. At least a portion of the microphone module 280 may be disposed between the camera housing 210 and the first printed circuit board 240-1. A portion of the first printed circuit board 240-1 may overlap the camera housing 210. With reference to FIGS. 5 and 6, when the electronic device is viewed from the first direction or the second direction, a portion of the first printed circuit board 240-1 may overlap the camera housing 210. In other words, a portion of the first printed circuit board 240-1 may extend to a portion where the camera housing 210 is disposed. The first printed circuit board 240-1 may extend to a portion where the camera housing 210 is disposed, so that an area of utilization (a portion in which electronic components may be disposed) of the first printed circuit board 240-1 may be increased.

The microphone structure according to various embodiments may include a microphone module 280, a conduit for transmitting external sound to the microphone module 280, and a first printed circuit board 240-1 to which the microphone module 280 is connected. Here, the first printed circuit board 240-1 may be one of the printed circuit boards 240 included in the electronic device 200.

According to various embodiments, the camera housing 210 may be disposed in a first direction (e.g., +Z direction in FIG. 6) with respect to the microphone module 280. The camera housing 210 may be a housing for protecting the camera module 230 disposed adjacent to the microphone module 280.

According to various embodiments, at least a portion of the printed circuit board 240-1 may be disposed in a second direction (e.g., −Z direction in FIG. 6) opposite to the first direction with respect to the microphone module 280. When the microphone module 280 is viewed from the first direction, the microphone module 280 and the printed circuit board 240-1 may partially overlap. The printed circuit board 240-1 and the microphone module 280 may be electrically connected to each other. The microphone module 280 may convert the sound received through the conduit structure into an electrical signal and transmit it to the printed circuit board 240-1.

According to various embodiments, the conduit structure may include a first path 310 and a second path 320. In an embodiment, the first path 310 may be formed in the camera housing 210 in a third direction (e.g., −X direction in FIG. 6) perpendicular to both the first direction and the second direction. The first path 310 may be formed in the camera housing 210 at a portion adjacent to the cover member. In an embodiment, the second path 320 may be formed in the camera housing 210 and connected to the first path 310. The external sound transmitted through the first path 310 may be transmitted to the microphone module 280 through the second path 320.

The electronic device according to various example embodiments may include: a camera module including at least one camera, a camera housing disposed to cover the camera module in a first direction, a microphone module including at least one microphone disposed at the camera housing in a second direction opposite to the first direction, a first path formed in the camera housing in a third direction perpendicular to the first direction and the second direction, and a second path formed in the camera housing to connect the first path and the microphone module.

In addition, the camera housing may include: a body, a window at least a portion of which is formed of a material with high light transmittance and disposed on the body, and an adhesive member including an adhesive material having low light transmittance and disposed between the body and the window to fix the window to the body.

In addition, the second path may be formed by closing a space formed in at least a part of the body in the first direction by the adhesive member.

In addition, the second path may be formed by closing a space formed in at least a part of the body in the first direction by the window.

The camera housing may further include: a printed circuit board disposed spaced apart in the second direction and having at least a partial region overlapping the camera housing when viewed from the first direction or the second direction.

In addition, at least a portion of the microphone module may be disposed between the camera housing and the printed circuit board.

In addition, in the first path and the second path, a material having low light transmittance may be disposed in a portion adjacent to the first path.

The microphone structure according to various example embodiments may include: a microphone module including at least one microphone, a conduit formed in a camera housing disposed in a first direction with respect to the microphone module to cover the camera module disposed adjacent to the microphone module and configured to transmit external sound to the microphone module, and a printed circuit board at least a part of which is disposed in a second direction opposite to the first direction with respect to the microphone module and to which the microphone module is electrically connected, wherein the conduit may include a first path formed in the camera housing in the first direction and a third direction perpendicular to the second direction, and a second path connecting the first path and the microphone module.

In addition, the camera housing in which the conduit is formed may include, a body, a window at least a portion of which is formed of a material having high light transmittance and disposed on the body, and an adhesive member including an adhesive material having low light transmittance and disposed between the body and the window to fix the window to the body.

In addition, the second path of the conduit structure may be formed by the adhesive member covering a space formed in at least a part of the body.

In addition, the second path of the conduit structure may be formed by the window covering a space formed in at least a part of the body.

In addition, the printed circuit board may extend to a portion where the camera housing is disposed so that the camera housing and a partial region overlap.

In the second path, a material having low light transmittance may be disposed in the first path and in a portion adjacent to the first path in the second path.

The electronic device according to various example embodiments may include: a camera module including at least one camera, a microphone module including at least one microphone, a camera housing disposed to cover the camera module and the microphone module, a cover at least a portion of which is disposed adjacent to the camera housing and disposed to cover one surface of the electronic device, a first path formed in the camera housing at a portion where the camera housing and the cover member face each other, and a second path formed in the camera housing to connect the first path and the microphone module.

In addition, the camera housing may include a body, a window at least a portion of which is formed of a material having high light transmittance and disposed on the body, and an adhesive member including an adhesive material having low light transmittance and disposed between the body and the window member to fix the window member to the body.

In addition, the second path may be formed by the adhesive member covering a space formed in at least a part of the body.

In addition, the second path may be formed by the window covering a space formed in at least a part of the body.

The camera may further include a printed circuit board spaced apart from the camera housing in a second direction and overlapping the camera housing with at least a partial region when viewed from the second direction.

In addition, at least a portion of the microphone module may be disposed between the camera housing and the printed circuit board.

In addition, in the first path and the second path, a material having low light transmittance may be disposed in a portion adjacent to the first path.

The various example embodiments of the disclosure and drawings are merely provided as examples in order to explain the technical contents and aid understanding the disclosure, and they are not intended to limit the scope of the disclosure. Therefore, the scope of the disclosure should be understood to include all changes or modifications derived from the technical ideas of the disclosure in addition to the various example embodiments disclosed herein. It will also be understood that any of the embodiment(s) described herein may be used in conjunction with any other embodiment(s) described herein.

What is claimed is:

1. An electronic device comprising:
    a camera module comprising at least one camera;
    a camera housing disposed to cover the camera module in a first direction;
    a microphone module including at least one microphone disposed in the camera housing in a second direction opposite to the first direction;
    a first path formed in the camera housing in a third direction perpendicular to the first direction and the second direction; and
    a second path formed in the camera housing to connect the first path and the microphone module,
    wherein the camera housing comprises a body and a window disposed on the body, and
    wherein the second path is formed by the window closing a space formed in at least a part of the body in the first direction.

2. The electronic device of claim 1, wherein the camera housing further comprises: an adhesive member disposed between the body and the window to fix the window to the body,
    wherein at least a portion of the window is formed of a material having first light transmittance,
    wherein the adhesive member comprises an adhesive material having second light transmittance, and
    wherein the first light transmittance is greater than the second light transmittance.

3. The electronic device of claim 2, wherein the second path is formed by the adhesive member closing a space formed in at least a part of the body in the first direction.

4. The electronic device of claim 1, further comprising a printed circuit board spaced apart from the camera housing in the second direction and having at least a partial area overlapping the camera housing when viewed from the first direction or the second direction.

5. The electronic device of claim 4, wherein at least a portion of the microphone module is disposed between the camera housing and the printed circuit board.

6. The electronic device of claim 1, wherein in the first path and the second path, a material having a light transmittance less than a predetermined value is disposed in a portion adjacent to the first path.

7. A microphone structure comprising:
    a microphone module including at least one microphone;
    a conduit formed in a camera housing disposed in a first direction with respect to the microphone module to cover a camera module disposed adjacent to the microphone module and configured to transmit external sound to the microphone module; and
    a printed circuit board at least a portion of which is disposed in a second direction opposite to the first direction with respect to the microphone module and to which the microphone module is electrically connected,
    wherein the conduit comprises:
    a first path formed in the camera housing in a third direction perpendicular to the first direction and the second direction; and a second path connecting the first path and the microphone module, wherein the camera housing comprises a body and a window disposed on the body, and wherein the second path is formed by the window closing a space formed in at least a part of the body in the first direction.

8. The microphone structure of claim 7, wherein the camera housing in which the conduit is formed further comprises an adhesive member disposed between the body and the window to fix the window to the body, wherein at least a portion of the window is formed of a material having a first light transmittance, wherein the adhesive member comprises an adhesive material having a second light transmittance, and wherein the first light transmittance is greater than the second light transmittance.

9. The microphone structure of claim 8, wherein the second path of the conduit is formed by the adhesive member covering a space formed in at least a part of the body.

10. The microphone structure of claim 7, wherein the printed circuit board extends to a portion where the camera housing is disposed so that the camera housing and a partial region overlap.

11. The microphone structure of claim 7, wherein in the first path and the second path, a material having a light transmittance less than a predetermined value is disposed in a portion adjacent to the first path.

12. An electronic device comprising:

a camera module including at least one camera;

a microphone module including at least one microphone;

a camera housing disposed to cover the camera module and the microphone module, the camera housing covering the camera module in a first direction;

a cover at least a portion of which is disposed adjacent to the camera housing and disposed to cover one surface of the electronic device;

a first path formed in the camera housing at a portion where the camera housing and the cover face each other; and a second path formed in the camera housing to connect the first path and the microphone module, wherein the camera housing comprises a body and a window disposed on the body, and wherein the second path is formed by the window closing a space formed in at least a part of the body in the first direction.

13. The electronic device of claim 12, wherein the camera housing further comprises an adhesive member disposed between the body and the window to fix the window to the body, wherein at least a portion of the window is formed of a material having a first light transmittance, wherein the adhesive member comprises an adhesive material having a second light transmittance, and wherein the first light transmittance is greater than the second light transmittance.

14. The electronic device of claim 13, wherein the second path is formed by the adhesive member covering a space formed in at least a part of the body.

15. The electronic device of claim 12, further comprising a printed circuit board spaced apart from the camera housing in a second direction and having at least a partial area overlapping the camera housing when viewed from the second direction.

16. The electronic device of claim 15, wherein at least a portion of the microphone module is disposed between the camera housing and the printed circuit board.

17. The electronic device of claim 12, wherein in the first path and the second path, a material having a light transmittance less than a predetermined value is disposed in a portion adjacent to the first path.

* * * * *